(12) United States Patent
Qu et al.

(10) Patent No.: US 12,250,001 B1
(45) Date of Patent: Mar. 11, 2025

(54) ANALOG-TO-DIGITAL CONVERTER

(71) Applicant: Silergy Semiconductor Technology (Hangzhou) LTD, Zhejiang (CN)

(72) Inventors: Guangyang Qu, Hangzhou (CN); Chen Lai, Hangzhou (CN)

(73) Assignee: Silergy Semiconductor Technology (Hangzhou) LTD, Hangzhou (CN)

(*) Notice: Subject to any disclaimer, the term of this patent is extended or adjusted under 35 U.S.C. 154(b) by 318 days.

(21) Appl. No.: 17/969,914

(22) Filed: Oct. 20, 2022

(30) Foreign Application Priority Data

Nov. 5, 2021 (CN) .......... 202111304548.1

(51) Int. Cl.
*H03M 1/12* (2006.01)
*H03M 1/06* (2006.01)
*H03M 1/42* (2006.01)

(52) U.S. Cl.
CPC ....... *H03M 1/1255* (2013.01); *H03M 1/0687* (2013.01); *H03M 1/42* (2013.01)

(58) Field of Classification Search
CPC ..... H03M 1/1255; H03M 1/0687; H03M 1/42
USPC .................................................. 341/155, 172
See application file for complete search history.

(56) References Cited

U.S. PATENT DOCUMENTS

| | | | |
|---|---|---|---|
| 8,421,658 B1* | 4/2013 | Yau | H03M 1/1004 341/172 |
| 9,054,727 B2 | 6/2015 | Steensgaard-Madsen | |
| 9,071,267 B1 | 6/2015 | Schneider et al. | |
| 9,571,115 B1 | 2/2017 | Beukema et al. | |
| 9,712,772 B2 | 7/2017 | Kim et al. | |
| 9,742,424 B2 | 8/2017 | Sharma et al. | |
| 9,954,549 B2 | 4/2018 | Venca et al. | |
| 10,659,075 B2 | 5/2020 | Inamdar et al. | |
| 10,707,886 B2 | 7/2020 | Chen et al. | |
| 2014/0085118 A1* | 3/2014 | Tsai | H03M 1/462 341/122 |
| 2016/0065232 A1* | 3/2016 | Dagher | H03M 3/458 341/158 |

* cited by examiner

*Primary Examiner* — Jean B Jeanglaude

(57) ABSTRACT

An analog-to-digital converter can include: a charge distribution and holding module configured to sample a to-be-converted signal, and to perform subtraction on the to-be-converted signal and a target reference voltage by charge distribution, in order to generate a positive-phase output voltage and a negative-phase output voltage on a first and second electric rails, respectively; a common-mode voltage compensation module coupled with the first and second electric rails, and being configured to inject common-mode charges to compensate the distributed charges of the charge distribution and holding module, and to reduce a difference between a common-mode output voltage of the charge distribution and holding module and an expected value; and a comparator configured to provide a logic signal based on a comparison between the positive-phase output voltage and the negative-phase output voltage, where the logic signal corresponds to a target digital signal of the analog-to-digital converter.

16 Claims, 3 Drawing Sheets

ANALOG-TO-DIGITAL CONVERTER

RELATED APPLICATIONS

This application claims the benefit of Chinese Patent Application No. 202111304548.1, filed on Nov. 5, 2021, which is incorporated herein by reference in its entirety.

FIELD OF THE INVENTION

The present invention generally relates to the field of electronic circuits, and more particularly, to analog-to-digital converters.

BACKGROUND

With the rapid development of integrated circuits, computer technology, medical technology, wireless sensor networks, and other technologies, portable and intelligent electronic products (e.g., smart home appliances, health and medical home electronic equipment, etc.) have become more popular. Among them, the analog-to-digital converter (ADC) plays a vital role as a link between the analog signal world and the digital signal world. Sensors perceive and collect various analog signals in the real world, convert them into digital signals that can be processed by ADCs, and then control devices to make various responses. Successive approximation analog-to-digital converters (SAR ADCs) have advantages of relatively low power consumption and high precision, and as such are widely used in wireless sensor networks and biomedical fields where power consumption and precision are required.

DETAILED DESCRIPTION

Reference may now be made in detail to particular embodiments of the invention, examples of which are illustrated in the accompanying drawings. While the invention may be described in conjunction with the preferred embodiments, it may be understood that they are not intended to limit the invention to these embodiments. On the contrary, the invention is intended to cover alternatives, modifications and equivalents that may be included within the spirit and scope of the invention as defined by the appended claims. Furthermore, in the following detailed description of the present invention, numerous specific details are set forth in order to provide a thorough understanding of the present invention. However, it may be readily apparent to one skilled in the art that the present invention may be practiced without these specific details. In other instances, well-known methods, procedures, processes, components, structures, and circuits have not been described in detail so as not to unnecessarily obscure aspects of the present invention.

Figure 1:
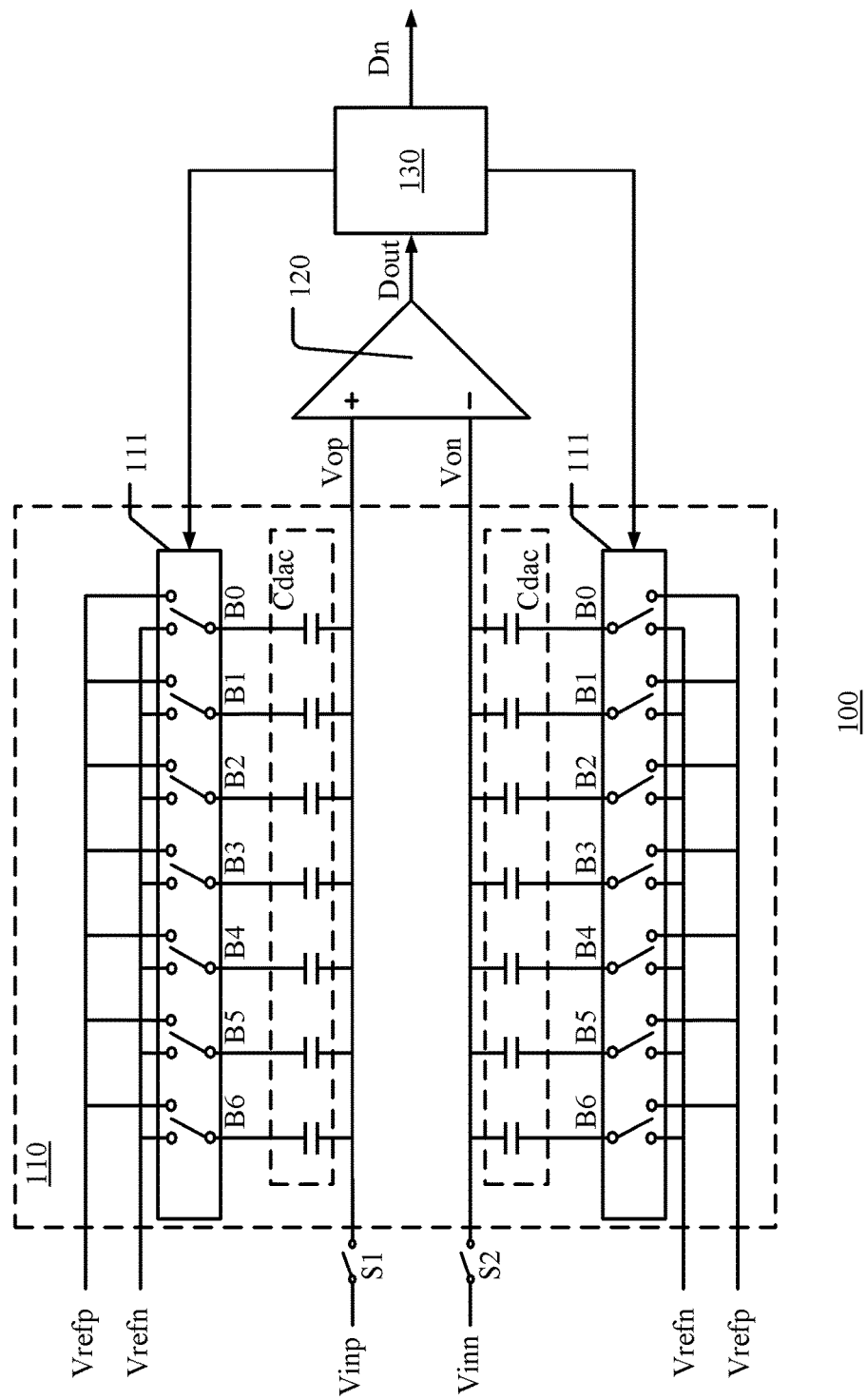
FIG. 1 is a schematic block diagram of an example successive approximation analog-to-digital converter.

Referring now to FIG. 1, shown is a schematic block diagram of an example successive approximation analog-to-digital converter. In this example, to-be converted signal Vin is processed into positive-phase input signal Vinp and negative-phase input signal Vinn according to power supply voltage VDD, which are respectively supplied to first and second electric rail sof the analog-to-digital conversion converter. The analog-to-digital converter can sample to-be-converted signal Vin according to positive-phase input voltage Vinp and negative-phase input voltage Vinn, adjust the access of the reference voltages (e.g., including reference voltage Vrefp and reference voltage Vrefn) through first and second capacitor arrays to distribute the charge. This can realize the subtraction of positive-phase input voltage Vrefp and negative-phase input voltage Vrefn with target reference voltage Vdac, respectively, and may provide positive-phase output voltage Vop and negative-phase output voltage Von on the first and second electric rails, respectively.

In this way, the difference between positive-phase output voltage Vop and negative-phase output voltage Von can be equal to the difference between to-be converted signal Vin and target reference voltage Vdac; that is, Vop−Von=Vin−Vdac. The first and second electric rails can also be respectively connected with the first and second capacitor arrays (e.g., the two capacitor arrays Cdac are symmetrical in structure). Further, comparator 120 can compare positive-phase output voltage Vop against negative-phase output voltage Von to directly obtain the comparison result of to-be-converted signal Vin and target reference voltage Vdac, thereby realizing the analog-to-digital conversion.

The common-mode input voltage of comparator 120 can be equal to half of the sum of positive-phase output voltage Vop and negative-phase output voltage Von. The sum of positive-phase output voltage Vop and negative-phase output voltage Von may be related to the sum of positive-phase input voltage Vinp and negative-phase input voltage Vinn, and the sum of positive-phase input voltage Vinp and negative-phase input voltage Vinn can be equal to power supply voltage VDD. However, power supply voltage VDD may actually fluctuate, such that the actual common-mode input voltage of comparator 120 may vary with power supply voltage VDD, and the operating reliability can be easily disturbed by the power supply voltage.

In FIG. 1, analog-to-digital converter 100 is a charge redistribution type analog-to-digital converter, including charge distribution and holding module 110, comparator 120, and successive approximation control logic module 130. In this particular example, charge distribution and holding module 110 can connect with positive-phase input voltage Vinp and negative-phase input voltage Vinn to receive the charge, and can connect with reference voltage Vrefp and reference voltage Vrefn to control the distribution of the charge. Also, charge distribution and holding module 110 can control the output voltage of positive-phase output voltage Vop and negative-phase output voltage Von. Comparator 120 can compare positive-phase output voltage Vop against negative-phase output voltage Von provided by charge distribution and holding module 110 to provide logic signal Dout. In this example, the difference between positive-phase output voltage Vop and negative-phase output voltage Von can be equal to the difference between to-be converted signal Vin and target reference voltage Vdac; that is, Vop−Von=Vin−Vdac. The target reference voltage can be adjusted by charge distribution and holding module 110, such that the voltage of to-be-converted signal Vin may be confirmed by comparing to-be-converted signal Vin against different target reference voltages.

Here, positive-phase input voltage Vinp and negative-phase input voltage Vinn may be obtained by processing to-be-converted signal Vin and power supply voltage VDD, where the difference between positive-phase input voltage Vinp and negative-phase input voltage Vinn can be equal to to-be-converted signal Vin. That is, Vinp−Vinn=Vin, and the sum of the positive-phase input voltage Vinp and negative-phase input voltage Vinn can be equal to power supply voltage VDD; that is, Vinp+Vinn=VDD. In this example, charge distribution and holding module 110 can also include the first and second electric rails. The first electric rail can connect to positive-phase input voltage Vinp through switch S1, and may provide positive-phase output voltage Vop. The second power rail can connect to negative-phase input voltage Vinn through switch S2, and may provide negative-phase output voltage Von.

For example, two capacitor arrays Cdac may be symmetrical in structure. First terminals of the two capacitor arrays can respectively be connected to the first and second electric rails. For example, first terminals of the capacitors in one of the two capacitor arrays can connect to the first electric rail, and first terminals of the capacitors in the other capacitor array can connect to the second electric rail. Second terminals of the two capacitor arrays may respectively be connected with switch array 111 to control each capacitor in each capacitor array to selectively receive reference voltage Vrefp or reference voltage Vrefn. In this example, capacitor array Cdac can include 7 capacitors (e.g., respectively corresponding to terminals B0-B6), and the capacitance of the capacitors can increase sequentially from terminal B0 to B6 by a power of 2. For example, if the capacitance of the capacitor corresponding to terminal B0 is unit capacitance C, the capacitance of the capacitors is C, 2C, 4C, 8C, 16C, 32C in sequence, corresponding to the conversion of eight-bit binary numbers.

After obtaining logic signal Dout, successive approximation can control logic module 130 adjustment of switch array 111 according to the value of logic signal Dout, in order to adjust target reference voltage Vdac to be closer to to-be-converted signal Vin, and compared again. After that, the value of the to-be-converted signal Vin can be determined after several repetitions, and the converted digital value Dn can be output.

In this example, common-mode output voltage Vcmout of charge distribution and holding module 110 may satisfy Vcmout=(Vop+Von)/2, reference common-mode voltage Vcmref may satisfy Vcmref=(Vrefp+Vrefn)/2, and the common-mode input voltage Vcmin may satisfy Vcmin=(Vinp+Vinn)/2. Further, Vcmout=Vcm0+(Vcmref−Vcmin) and Vinp+Vinn=VDD, where VDD is the power supply voltage, and the power supply voltage generally has noise interference, such that there is a deviation between the actual common-mode output voltage Vcmout and expected value Vcm0. When the common-mode input voltage of comparator 120 is within the dynamic compatibility range, the accuracy of the comparison result can be guaranteed. If the deviation exceeds the dynamic compatibility range of the common-mode input voltage of comparator 120, the operating reliability of comparator 120 may be reduced, thereby reducing the accuracy of the comparison between positive-phase output voltage Vop and negative-phase output voltage Von, and reducing the reliability of the provided logic signal Dout. Thus, the conversion accuracy of analog-to-digital converter 100 and the system performance can be affected.

Figure 2:
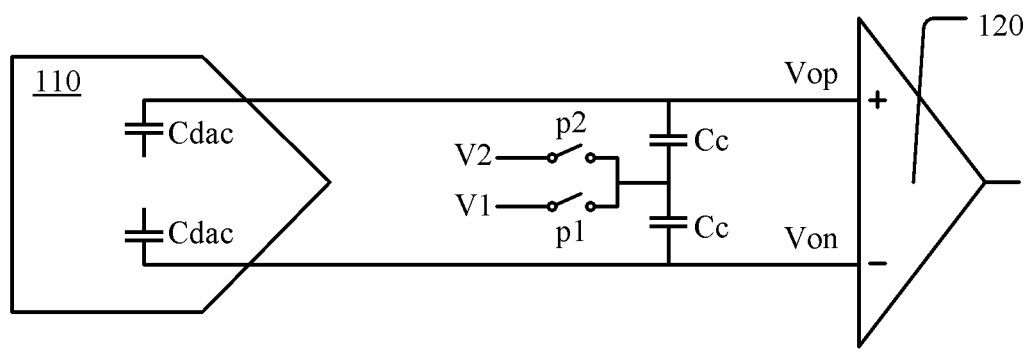
FIG. 2 is a schematic block diagram of an example analog-to-digital converter, in accordance with embodiments of the present invention.

Referring now to FIG. 2, shown is a schematic block diagram of an example analog-to-digital converter, in accordance with embodiments of the present invention. The basic structure of analog-to-digital converter 200 in this example is the same as the basic structure of analog-to-digital converter 100 shown in FIG. 1. In FIG. 2, analog-to-digital converter 200 is provided with a common-mode voltage compensation module on the output electric rail of charge distribution and holding module 110, in order to compensate the distributed charge of charge distribution and holding module 110 and reduce the deviation between the actual common-mode output voltage and the expected value, and improve the system accuracy.

In this example, the common-mode voltage compensation module can include two compensation capacitors Cc. A first terminal of one compensation capacitors Cc can connect to the first electric rail and a first terminal of the other compensation capacitors Cc can connect to the second electric rail. Second terminals of the two compensation capacitors Cc may selectively receive voltages V1 and V2 through switches P1 and P2. In this example, switches P1 and P2 can be complementarily turned on. For example, switches with the same conduction condition can be used, and two control signals with opposite control timings used for controlling the switches. Alternatively, the switches with opposite restrict condition conditions can be used, and the same control signal used for controlling the switches. It can be understood that the common mode voltage compensation module in certain embodiments can also be designed in comparator 120 and coupled to the input terminals of comparator 120, which can improve the dynamic compatibility range of the common-mode input voltage corresponding to the effective operation of comparator 120.

Figure 3:
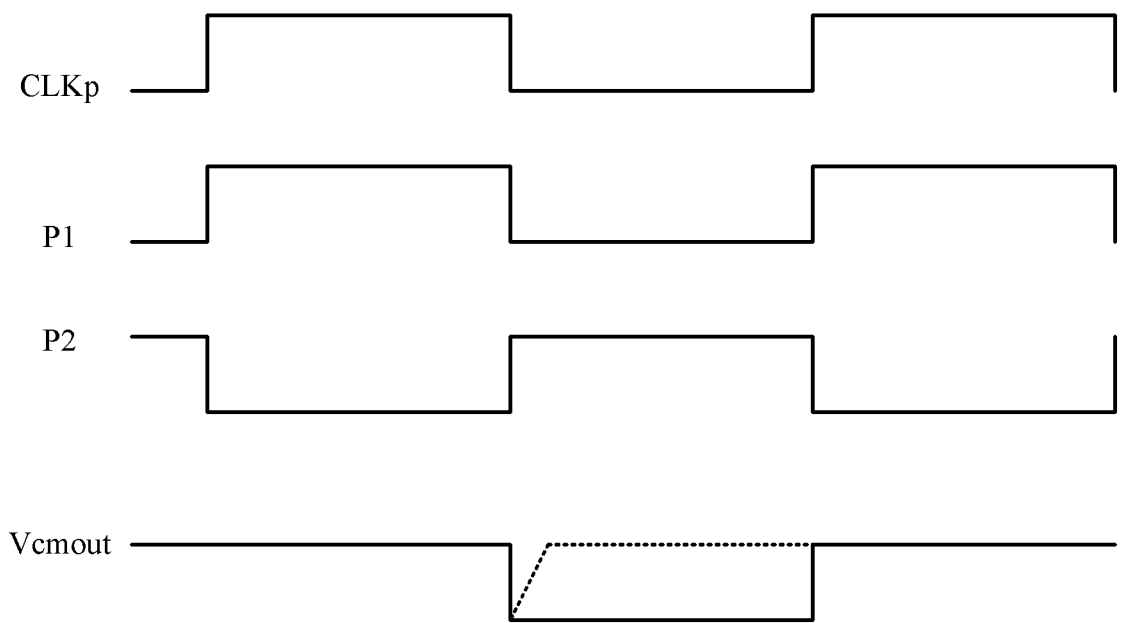
FIG. 3 is a waveform diagram of example compensation control of the analog-to-digital converter, in accordance with embodiments of the present invention.

Referring now to FIG. 3, shown is a waveform diagram of example compensation control of the analog-to-digital converter, in accordance with embodiments of the present invention. The dotted line corresponds to the compensated common-mode output voltage. With reference to FIGS. 2 and 3, analog-to-digital converter 200 can control switches P1 and P2 to be turned on in a time-divisional manner according to compensation control clock signal CLKp (or turned on alternately, which can be achieved by switching voltages V1 and V2), and control the received voltage of the second terminals of the two compensation capacitors Cc to switch between voltages V1 and V2. When switch P2 is turned on, the received voltage at the second terminal of each of compensation capacitors Cc can be switched from voltage V1 to voltage V2. Then, common-mode output voltage Vcmout can be adjusted to desired value Vcm0 through charge compensation, and kept at desired value Vcm0. When common-mode output voltage Vcmout deviates from expected value Vcm0, common-mode output voltage Vcmout can be pulled back to expected value Vcm0 by switching the received voltage at the second terminals of the two compensation capacitors Cc to compensate the charges of the capacitor arrays corresponding to the first and second electric rails. Here for example, voltage V2 is greater than voltage V1.

There are many choices for the timing of the corresponding switching compensation for common-mode output voltage Vcmout. It can be considered according to the convenience of control or the accuracy of system requirements. For example, the analog-to-digital converter may perform switching compensation in the whole process after sampling to-be-converted signal Vin, or the compensation can be performed during the approximation comparison of some bits of the binary number (e.g., when the analog signal input value Vin is close to target reference voltage Vdac required for the comparison of the corresponding bit), or the switching compensation may be performed when the error correction capability of the system is insufficient, thereby ensuring the accuracy of analog-to-digital conversion. That is, the compensation for the distributed charge of the charge distribution and holding module 110 can be performed during the comparison between the to-be-converted signal and at least a part of the target reference voltages among the plurality of target reference voltages. Also, the conversion operation of the digital values of some bits of the analog-to-digital conversion may be performed, such that the accuracy of analog-to-digital conversion of error-prone partial bits can be improved.

For analog-to-digital converter 200 in particular embodiments, the common-mode output voltage may satisfy: Vcmout=Vcm0+E1, E1=(Vcmref−Vcmin)×Cdac÷(Cdac+Cc)+(V2−V1)×Cc÷(Cdac+Cc), where Vcmout is the common-mode output voltage, Vcm0 is the expected value of the common-mode output voltage, Vcmref is the common-mode reference voltage, Vcmin is the common-mode input voltage, and Cdac is the capacitance value of each capacitor array Cdac (the capacitance values of two capacitor arrays are equal), Cc is the capacitance value of each compensation capacitor Cc, V1 is the first voltage, V2 is the second voltage, and E1 is the power supply error.

In this example, analog-to-digital converter 200 can control power supply error E1 to be zero or within a certain range based on the design of voltages V1 and V2 and the selection of compensation capacitor Cc, such that common-mode output voltage Vcmout is consistent with expected value Vcm0 within the allowable error range and the actual output value of common-mode output voltage Vcmout fluctuating with the power supply is within the effective range of the corresponding common-mode input voltage of comparator 120, thereby ensuring the accuracy of logic signal Dout provided by comparator 120 after being processed.

In alternative example, Cc=Cdac/2, V2=VDD, V1=GND, E1=Vcmref×2/3, while reference voltage Vrefp (e.g., equal to 4.5V) and reference voltage Vrefn (e.g., equal to reference ground GND) are stable reference values, and the corresponding common-mode reference voltage Vcmref is a stable value, such that the final common-mode output voltage Vcmout is a stable value, which can simply eliminate the effect of power supply voltage VDD to common-mode output voltage Vcmout. The reference voltage may correspond to the range of the analog-to-digital conversion, common-mode output voltage Vcmout corresponding to different selections can be different, and the specification of the corresponding comparator 120 can also be adaptively selected.

In yet another example, an active amplification unit may be provided for providing voltages V1 and V2, such that V2−V1=VDD*Cdac/(2*Cc). For example, V1=gnd, V2=(VDD−4.096V)*K, Cc=2C, where K (e.g., 33.5) can be realized by an operational amplifier circuit, a programmable gain amplifier (PGA) or a variable gain amplifier (VGA) to meet the gain amplification requirements, and the term of power supply voltage VDDin power supply error E1 can also be eliminated. In addition, Cc=2C, the capacitance value is relatively small, and thus the area of the first and second compensation capacitors can be relatively small, which can reduce the area occupied by the common-mode voltage compensation module. When the capacitance value of compensation capacitor Cc is smaller, the need for gain amplification is greater, which can be selected according to specific conditions.

In one example, Vcmref=2.25V, Vcmin=2.5V, Cdac=134C, V2=5V=VDD, V1=0V. Providing that Vcmout=Vcm0, then Cc≈6.7C, power supply error E1 can be zero, where C is the unit capacitance. Then, according to the estimated value of fixed error E2 caused by other interference factors, it can be obtained that Vcmref=Vcm0+E1+E2. Finally, it can be obtained that Cc=6.85C by further derivation and regulation, which the common-mode output voltage of charge distribution and holding module 110 of the 8-bit binary analog-to-digital converter 200 is effectively compensated to the expected value.

According to the dynamic compatibility range of the common-mode input voltage of comparator 120, the compensation target of E1 (or E1+E2) is to be within a range. For example, the common-mode voltage input by comparator 120 can be within the dynamic compatibility range of ±100 mV (e.g., the overall range is 0.9V±100 mV, 0.9V is the standard value of the common-mode input voltage of comparator 120, that is, Vcm0=0.9V), so it can guarantee the accuracy of the output. Thus, by adjusting the values of voltage V1, voltage V2, and compensation capacitor Cc according to the possible floating values of the reference voltage and the power supply voltage, power supply error E1 can be controlled to be within the range of ±100 mV.

That is, the range of power supply error can be within the dynamic compatibility range of the common-mode input voltage of comparator 120. In this particular example, the capacitance value of compensation capacitor Cc can also be designed to be 7C or 5C, and the final compensated common-mode output voltage Vcmout may be larger than expected value Vcm0 or less than expected value Vcm0 within the error range of ±100 mV, such that the comparison accuracy of comparator 120 and the reliability of the analog-to-digital conversion of analog-to-digital converter 200 can be guaranteed. In this example, compensation capacitor Cc may be obtained according to the series-parallel connection of the unit capacitor, and the capacitance value of compensation capacitor Cc designed to be a multiple of the unit capacitor.

In particular embodiments, an analog-to-digital converter can include a charge distribution and holding module, a common-mode voltage compensation module, and a comparator. The first and second electric rails of the charge distribution and holding module can be respectively connected to the first and second capacitor arrays. The to-be-converted signal may be sampled to one plate of the first and second capacitor arrays, and the other plate of the first and second capacitor arrays may receive the reference voltage, in order to distribute the charge and perform subtraction, and to provide the positive-phase output voltage and the negative-phase output voltage. The comparator can provide the logic signal according to the comparison of the positive-phase output voltage and the negative-phase output voltage, and the logic signal may correspond to the to-be-converted signal and the target reference voltage, thereby realizing the analog-to-digital conversion. The common-mode voltage compensation module can compensate the distributed charge of the charge distribution and holding module, which may reduce the difference between the common-mode output voltage of the charge distribution holding module and the expected value, and correspondingly reduce the difference between the actual common-mode input voltage of the comparator and the standard value, thereby improving the reliability of the comparison result of the comparator.

The embodiments were chosen and described in order to best explain the principles of the invention and its practical applications, to thereby enable others skilled in the art to best utilize the invention and various embodiments with modifications as are suited to particular use(s) contemplated. It is intended that the scope of the invention be defined by the claims appended hereto and their equivalents.

What is claimed is:

1. An analog-to-digital converter, comprising:
   a) a charge distribution and holding module configured to sample a to-be-converted signal, and to perform subtraction on the to-be-converted signal and a target reference voltage by charge distribution, in order to generate a positive-phase output voltage and a negative-phase output voltage on a first electric rail and a second electric rail, respectively, wherein a difference between the positive-phase output voltage and the negative-phase output voltage is equal to a difference between the to-be-converted signal and the target reference voltage;
   b) a common-mode voltage compensation module coupled with the first electric rail and the second electric rail, and being configured to inject common-mode charges to compensate the distributed charges of the charge distribution and holding module, and to reduce a difference between a common-mode output voltage of the charge distribution and holding module and an expected value; and
   c) a comparator configured to provide a logic signal based on a comparison between the positive-phase output voltage and the negative-phase output voltage, wherein the logic signal corresponds to a target digital signal of the analog-to-digital converter.

2. The analog-to-digital converter of claim 1, wherein:
   a) the positive-phase input voltage and the negative-phase input voltage are generated according to a power supply voltage after processing the to-be-converted signal;
   b) a difference between the positive-phase input voltage and the negative-phase input voltage is equal to the to-be-converted signal; and
   c) the sum of the positive-phase input voltage and the negative-phase input voltage is equal to the power supply voltage.

3. The analog-to-digital converter of claim 2, wherein the charge distribution and holding module comprises a first capacitor array and a second capacitor array, wherein:
   a) first terminals of the first and second capacitor arrays are respectively coupled to the first electric rail and the second electric rail, and second terminals of the first and second capacitor arrays are configured to receive the first reference voltage or the second reference voltage, in order to perform subtraction processing of the to-be-converted signal and the target reference voltage according to the received reference voltage; and
   b) the positive phase input voltage and the negative phase input voltage are respectively provided to the first electric rail and the second electric rail, and second terminals of the first and second electric rails are provided with the positive-phase output voltage and the negative-phase output voltage respectively.

4. The analog-to-digital converter of claim 3, wherein the common-mode voltage compensation module comprises a first compensation capacitor and a second compensation capacitor, wherein:
   a) first terminals of the first compensation capacitor and the second compensation capacitor are respectively connected to the first electric rail and the second electric rail; and
   b) second terminals of the first compensation capacitor and the second compensation capacitor are connected together to selectively receive a first voltage or a second voltage through a first switch and a second switch.

5. The analog-to-digital converter of claim 4, wherein:
   a) when a voltage received by the second terminals of the first and second compensation capacitors is switched from the first voltage to the second voltage, a difference between the common-mode output voltage of the charge distribution and holding module and the expected value is reduced; and
   b) the common-mode output voltage is equal to half of the sum of the positive-phase output voltage and the negative-phase output voltage.

6. The analog-to-digital converter of claim 4, wherein the first switch and the second switch are turned on alternately.

7. The analog-to-digital converter of claim 3, wherein:
   a) the common-mode output voltage satisfies: $Vcmout=Vcm0+E1$, $E1=(Vcmref-Vcmin) \times Cdac \div (Cdac+Cc)+(V2-V1) \times Cc \div (Cdac+Cc)$, wherein Vcmout is the common-mode output voltage, Vcm0 is the expected value of the common-mode output voltage, Vcmref is a common-mode reference voltage, Vcmin is the common-mode input voltage, and Cdac is a capacitance value of the first or the second capacitor array, Cc is a capacitance value of the first or the second compensation capacitor, V1 is the first voltage, V2 is the second voltage, and E1 is a power supply error; and
   b) the common-mode input voltage of the charge distribution and holding module is half of the power supply voltage, the difference between the second voltage and the first voltage is obtained according to the power supply voltage, and the capacitance values of the first compensation capacitor and the second compensation capacitor are obtained according to an effective range of the power supply error, the obtained first voltage and the second voltage.

8. The analog-to-digital converter of claim 7, wherein a range of the common-mode output voltage of the charge distribution and holding module is controlled within an effective range of the common-mode input voltage of the comparator by making the power supply error approach zero.

9. The analog-to-digital converter of claim 7, wherein:
   a) the second voltage is greater than the first voltage; and
   b) the first voltage and the second voltage are obtained according to one of: the power supply voltage, a divided voltage of the power supply voltage, the reference voltage, or a divided voltage of the reference voltage.

10. The analog-to-digital converter of claim 7, wherein capacitance values of the first compensation capacitor and the second compensation capacitor are confirmed according to the first voltage and the second voltage.

11. The analog-to-digital converter of claim 7, wherein the common-mode output voltage of the analog-to-digital converter further satisfies: $Vcmout=Vcm0+E1+E2$, wherein E2 is a fixed error, and the capacitance values of the first compensation capacitor and the second compensation capacitor are further adjusted according to the fixed error.

12. The analog-to-digital converter of claim 4, wherein the first compensation capacitor and the second compensation capacitor are obtained by connecting unit capacitors in series and in parallel, and a capacitance value of the unit capacitor is consistent with a minimum capacitance value in the first capacitor array and the second capacitor array.

13. The analog-to-digital converter of claim 4, wherein the capacitance values of the first compensation capacitor and the second compensation capacitor coincide with half of a capacitance value of the first capacitor array or the second capacitor array.

14. The analog-to-digital converter of claim 7, further comprising an active amplification unit configured to provide the second voltage and the first voltage, wherein the first voltage and the second voltage satisfy: V2−V1=VDD*Cdac/(2*Cc), wherein VDD is the power supply voltage, and the first voltage and the second voltage are obtained according to the power supply voltage and a capacitance value of the first compensation capacitor.

15. The analog-to-digital converter of claim 3, further comprising a successive approximation control logic module configured to control switching of the first reference voltage and the second reference voltage received by the first capacitor array and the second capacitor array according to the logic signal provided by the comparator, and to adjust the target reference voltage.

16. The analog-to-digital converter of claim 15, wherein compensation for the distributed charge of the charge distribution and holding module is performed during a comparison between the to-be-converted signal and at least part of target reference voltages among a plurality of target reference voltages.

* * * * *